(12) United States Patent
Ribarich et al.

(10) Patent No.: US 6,867,554 B2
(45) Date of Patent: Mar. 15, 2005

(54) BALLAST CONTROL CARD

(75) Inventors: Thomas J. Ribarich, Laguna Beach, CA (US); Dana Wilhelm, Temple City, CA (US); Derek Brown, Temecula, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/309,359

(22) Filed: Dec. 2, 2002

(65) Prior Publication Data

US 2003/0107331 A1 Jun. 12, 2003

Related U.S. Application Data

(60) Provisional application No. 60/334,608, filed on Dec. 3, 2001.

(51) Int. Cl.[7] .................................................. G05F 1/00
(52) U.S. Cl. ..................... 315/291; 439/327; 361/788
(58) Field of Search ................................. 315/219, 209, 315/291, 307; 439/327, 347; 361/674, 788

(56) References Cited

U.S. PATENT DOCUMENTS

| | | | |
|---|---|---|---|
| 4,381,476 A | * 4/1983 | Adachi et al. ............... 315/101 |
| 4,924,152 A | 5/1990 | Flickinger ................... 361/674 |
| 5,545,955 A | 8/1996 | Wood .......................... 315/363 |
| 5,815,371 A | * 9/1998 | Jeffries et al. .............. 361/704 |
| 5,854,542 A | * 12/1998 | Forbes ........................ 315/291 |
| 6,011,360 A | * 1/2000 | Gradzki et al. .............. 315/244 |
| 6,152,749 A | 11/2000 | Tseng et al. ................. 315/224 |
| 6,157,093 A | 12/2000 | Giannopoulos et al. ....... 307/38 |
| 6,165,025 A | 12/2000 | Meng .......................... 439/160 |
| 6,181,556 B1 | * 1/2001 | Allman ....................... 361/690 |
| 6,200,149 B1 | 3/2001 | Chi-Chung .................. 439/488 |
| 6,210,195 B1 | 4/2001 | Ma ............................. 439/152 |
| 6,211,623 B1 | 4/2001 | Wilhelm et al. ............. 315/291 |
| 6,227,887 B1 | 5/2001 | Choy .......................... 439/485 |
| 6,227,898 B1 | 5/2001 | Meng et al. ................. 439/374 |
| 6,231,399 B1 | 5/2001 | Meng .......................... 439/79 |
| 6,238,226 B1 | 5/2001 | Schempp et al. ........... 439/636 |
| 6,254,435 B1 | 7/2001 | Cheong et al. .............. 439/60 |
| 6,310,440 B1 | 10/2001 | Lansing et al. ............. 315/149 |
| 6,328,572 B1 | 12/2001 | Higashida et al. .......... 361/788 |
| 6,339,298 B1 | 1/2002 | Chen .......................... 315/224 |
| 6,641,035 B1 | * 11/2003 | Predescu et al. ............ 235/380 |

* cited by examiner

*Primary Examiner*—Don Wong
*Assistant Examiner*—Jimmy Vu
(74) *Attorney, Agent, or Firm*—Ostrolenk, Faber, Gerb & Soffen, LLP

(57) ABSTRACT

A ballast control provided on a through-slot wave solderable daughter card package that is vertically mountable on a mother board.

2 Claims, 12 Drawing Sheets

Top Layer

Top Silk Layer

Bottom Layer

Bottom Solder Mask

NOTES:
Number of layer ST 1
Plating None
SMT Yet
Solder mask Type t LPI Green
Silk Screen M Sides both sides
Silkscreen color white
Finished track to be +/-20% at original artwork.
Minimum air gaps 10 nil
Material to be FR4 per Mil-P 13948 glass epoxy laminate
Apply silkscreen to both sides using non conductive white, epoxy int. paint.
Solder level all exposed copper
Vendor UL frame code 94V-0 to be clearly marked on PCB.
Apply green liquid photo inaquable solder mask over bar copper.

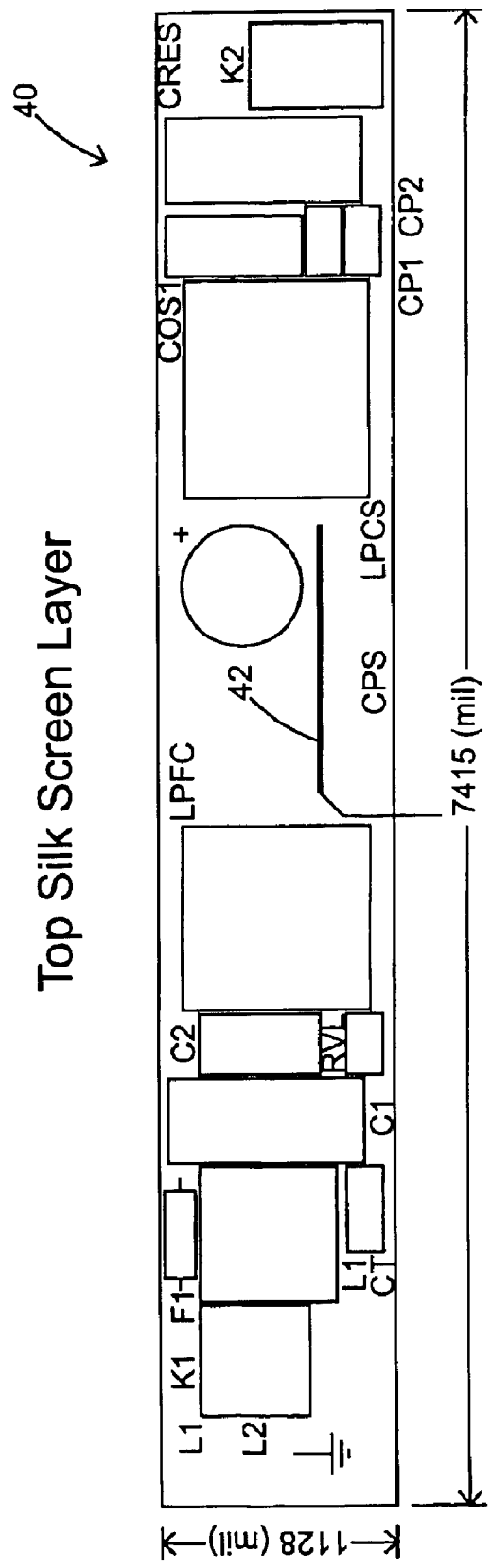

Figure 9

NOTES:
Number of layer ST 1
Plating None
SMT Yet
Solder mask Type t LPI Green
Silk Screen M Sides both sides
Silkscreen color white
Finished track to be +/-20% at original artwork.
Minimum air gaps 10 mil
Material to be FR4 per Mil-P 13948 glass epoxy laminate
Apply silkscreen to both sides using non conductive white, epoxy int. paint.
Solder level all exposed copper
Vendor UL frame code 94V-0 to be clearly marked on PCB.
Apply green liquid photo inaquable solder mask over bar copper.

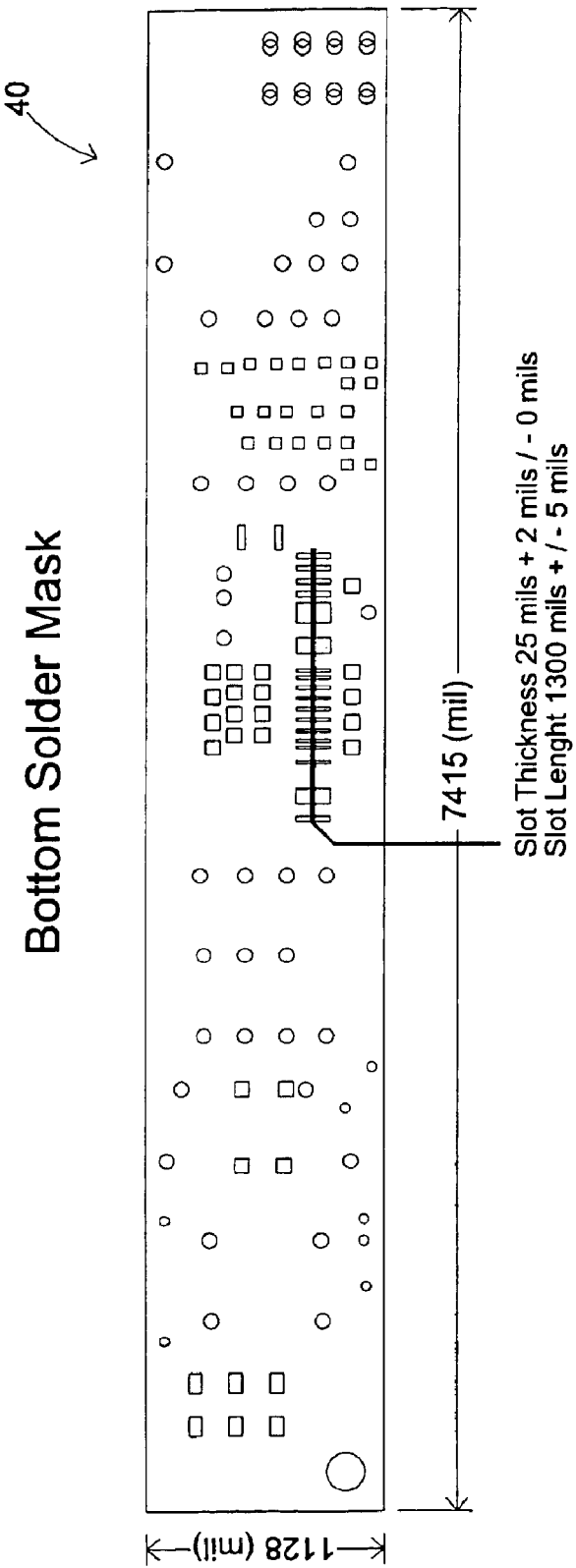

Figure 11

BALLAST CONTROL CARD

Priority is claimed under 35 U.S.C. §119: Convention Date Dec. 3, 2001 for U.S. Provisional Appln. No. 60/334,608.

BACKGROUND OF THE INVENTION

1. Field of the Invention

The present invention relates to a ballast control card, and more particularly, to a ballast control circuit provided on a through-slot wave solderable daughter card that is vertically mountable on a mother board.

2. Description of the Related Art

Electronic ballasts for controlling fluorescent or high-intensity discharge (HID) lamps usually require electronics necessary for preheating the lamp filaments, striking the lamp, driving the lamp to a given power, detecting lamp fault conditions, and safely deactivating the circuit.

Electronic ballasts for gas discharge circuits have come into widespread use because of the availability of power MOSFET switching devices and insulated gate bipolar transistors (IGBTs) that can replace previously used power bipolar switching devices. A number of integrated circuits (ICs) have been devised for driving gates of power MOSFETs or IGBTs in electronic ballasts. Examples include the IR2155, IR2157, and IR21571 products sold by International Rectifier Corporation and described in U.S. Pat. Nos. 5,545,955 and 6,211,623, the disclosures of which are incorporated herein by reference in their entireties.

SUMMARY OF THE INVENTION

The invention provides a fully integrated, fully protected 600V ballast control card designed to drive all types of fluorescent lamps. The ballast control card includes boost-type power factor correction (PFC) control and half-bridge ballast control for controlling a complete active power factor electronic ballast. The ballast control card of the present invention incorporates the ballast control IC with power factor correction disclosed in U.S. patent application Ser. No. 09/981,753 filed Oct. 19, 2001, the entire disclosure of which is incorporated herein by reference, and includes, together with the IC, the two power FETs, the PFC FET and related passive components.

In accordance with the present invention, ballast control circuitry, including the control IC and FETs, is provided on a through-slot wave solderable daughter card. The daughter card mounts vertically onto a mother board. Pads surrounding a slot formed through the mother board are soldered to pads on the vertical daughter card in a wave solder bath during production.

The ballast control card of the present invention greatly simplifies ballast design and drastically reduces ballast component count. Externally programmable features such as DC bus voltage level, preheat time and frequency, ignition ramp characteristics, and running mode operating frequency provide a high degree of flexibility for the ballast design engineer.

Comprehensive protection features such as protection from failure of a lamp to strike, filament failures, asymmetrical lamp voltage (end-of-life), low AC line condition, thermal overload, and lamp failure during normal operation, as well as an automatic restart function, have been included in the design.

The ballast control card of the present invention has the following features:

Fully Integrated Ballast Control Card.
Critical-Conduction Mode Boost Type PFC
Half-Bridge Ballast Output
Charge Pump Supply Input
Programmable Preheat Time & Frequency
Programmable Ignition Ramp
Programmable Over-Current
Internal Fault Counter
Assymetrical Lamp Voltage Protection
Lamp Filament Sensing & Protection
Capacitive Mode Protection
Brown-Out Protection
Dynamic Restart
Automatic Restart for Lamp Exchange
Thermal Overload Protection
Internal 15.6V Zener Clamp Diode on VCC
Through-slot Wave-solderable Card Package Other features and advantages of the present invention will become apparent from the following description of the invention which refers to the accompanying drawings.

BRIEF DESCRIPTION OF THE DRAWINGS

FIG. 9 shows a top silk screen layer for a ballast motherboard according to the present invention.

FIG. 11 shows a bottom solder mask for a ballast motherboard according to the present invention.

DETAILED DESCRIPTION OF EMBODIMENTS OF THE INVENTION

Figure 1:
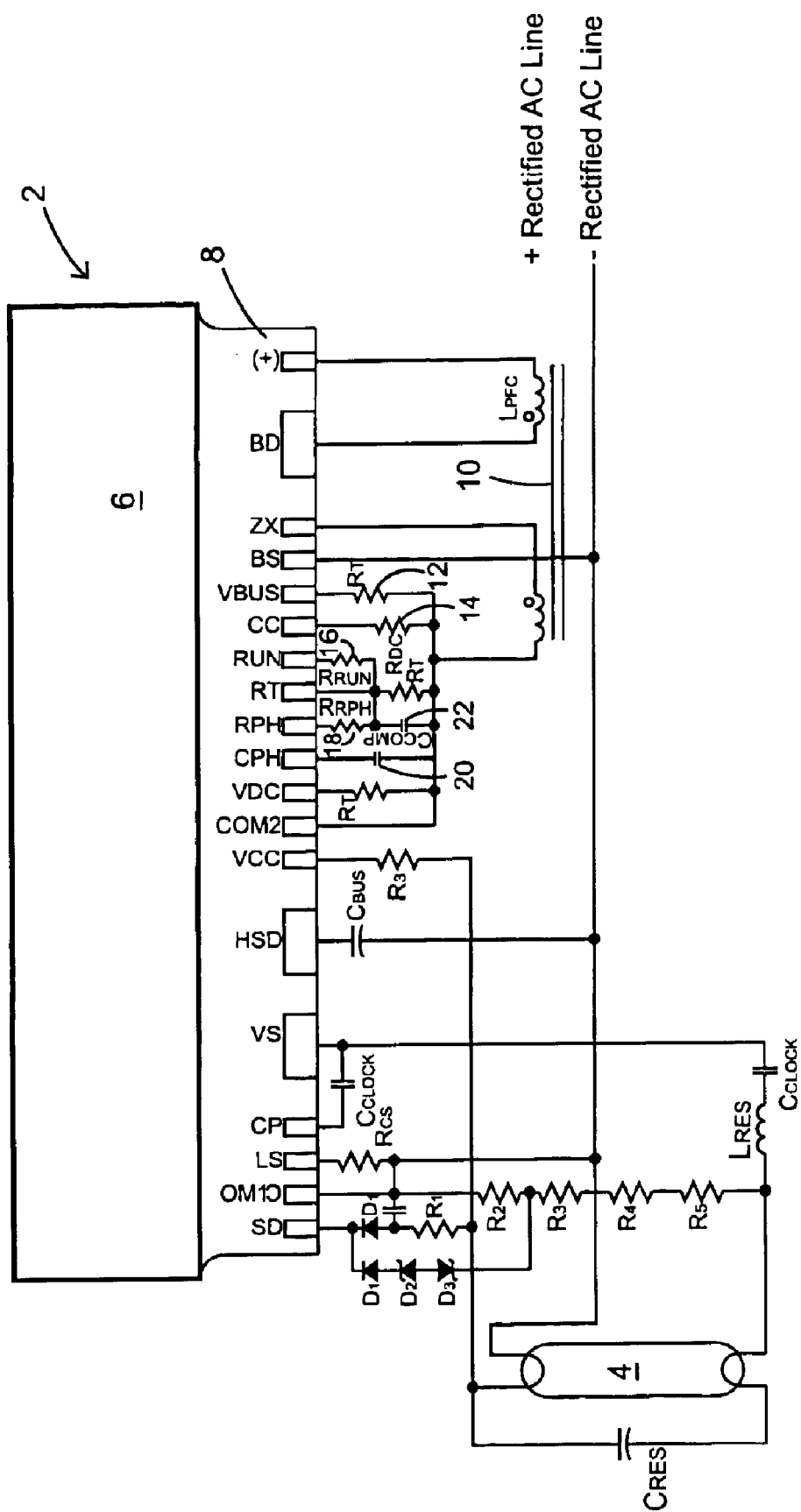
FIG. 1 is a typical application diagram for the ballast control card of the present invention.

Referring to FIG. 1, a typical connection diagram for the ballast control card 2 of the present invention is shown schematically. The ballast drives a fluorescent lamp 4. A cover 6 is provided over internal ballast control circuit components (described further below) mounted on circuit board 8. The card typically is 37.05 mm by 14.5 mm. The thickness of the card is about 25 mils.

Programmable features of the ballast control, such as DC bus voltage level, preheat time and frequency, ignition ramp characteristics, and running mode operating frequency, are established by connecting external components to connecting pads provided on the edge of the ballast control card, as follows:

| | |
|---|---|
| + | Rectified AC line input |
| BD | Boost FET drain |
| ZX | Zero-crossing, PFC inductor |
| BS | Boost FET source |
| VBUS | DC bus voltage level programming resistor |
| OC | Over-current (SC+) threshold programming |
| RUN | Run frequency resistor |
| RT | Oscillator timing resistor |
| RPH | Preheat frequency resistor and ignition ramp capacitor |
| CPH | Preheat timing capacitor |
| VDC | AC line turn-on voltage programming resistor |
| COM2 | Programmable components ground |
| VCC | Logic and low-side gate drive supply |
| HSD | High-side FET drain |
| VS | Half-bridge output |
| CP | Charge pump input |
| LS | Low-side FET source and current sensing input |
| COM1 | IC power and signal ground |
| SD | Shutdown input |

Typical external components are shown schematically in FIG. 1. The external components preferably are mounted on a mother board, which receives the ballast control daughter board, as described further below.

The ballast control receives power from a positive rectified AC line input which is applied, via transformer 10, to both the PFC circuitry and the main control circuitry. Resistor 12 allows external programming of a DC bus voltage level. An over-current threshold is established using resistor 14. Resistor 16 establishes a running mode frequency. Preheat timing is programmed by way of resistor 18 and capacitor 20. Capacitor 22 programs an ignition ramp.

Figure 2:
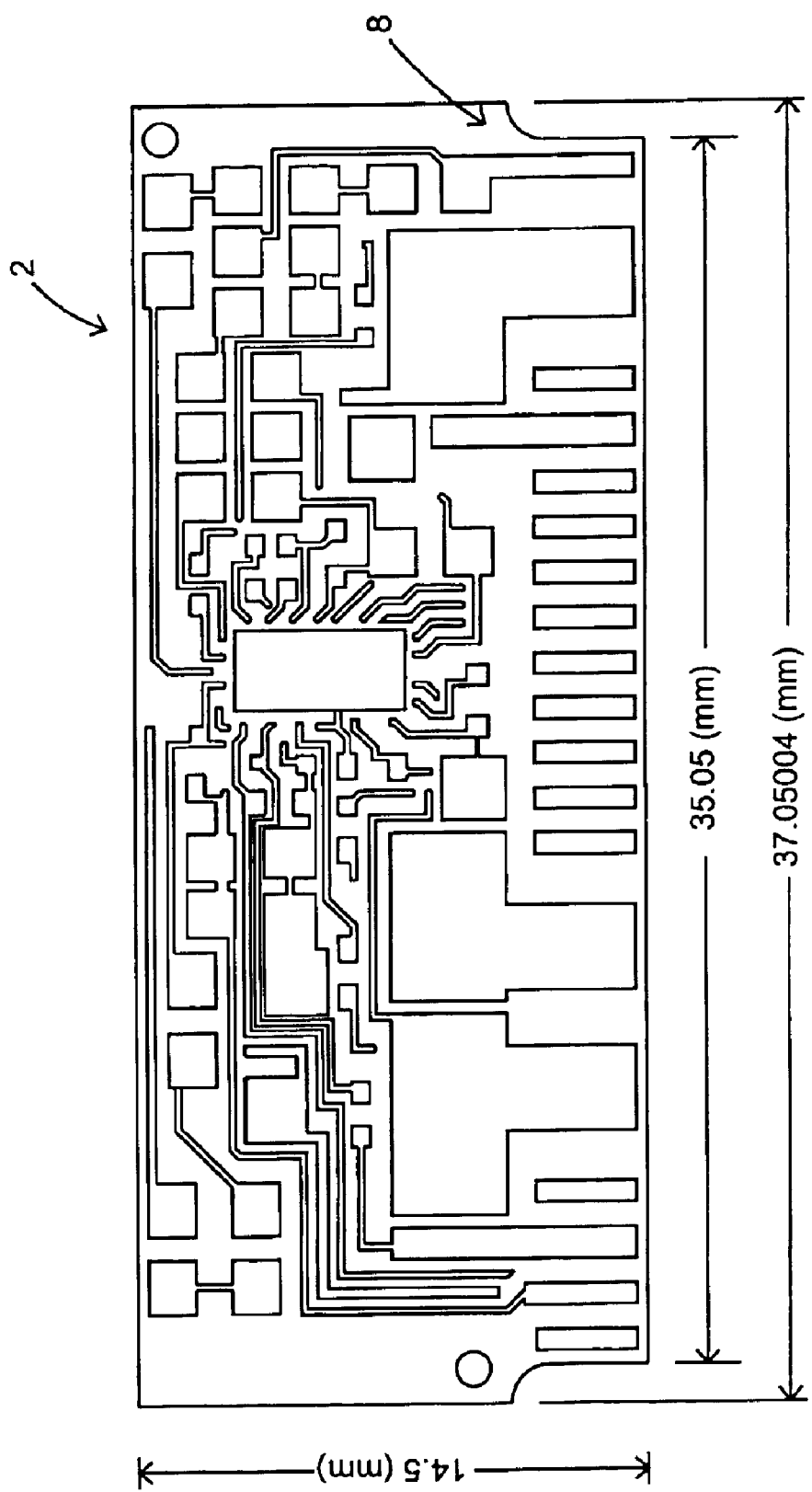
FIG. 2 illustrates a top trace layer of the ballast control card of FIG. 1.
Figure 3:
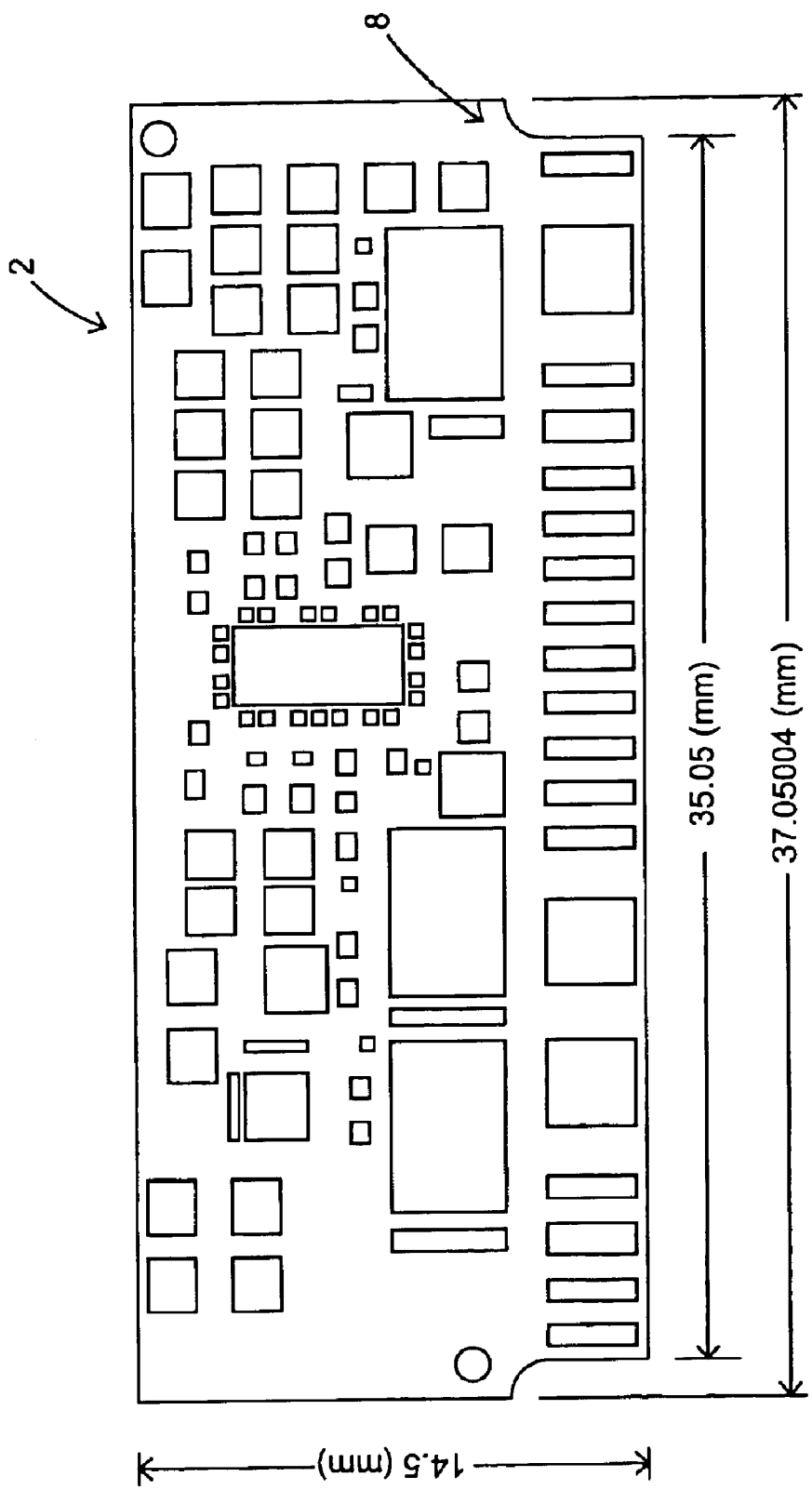
FIG. 3 shows a top solder mask for the ballast control card of FIG. 1.
Figure 4:
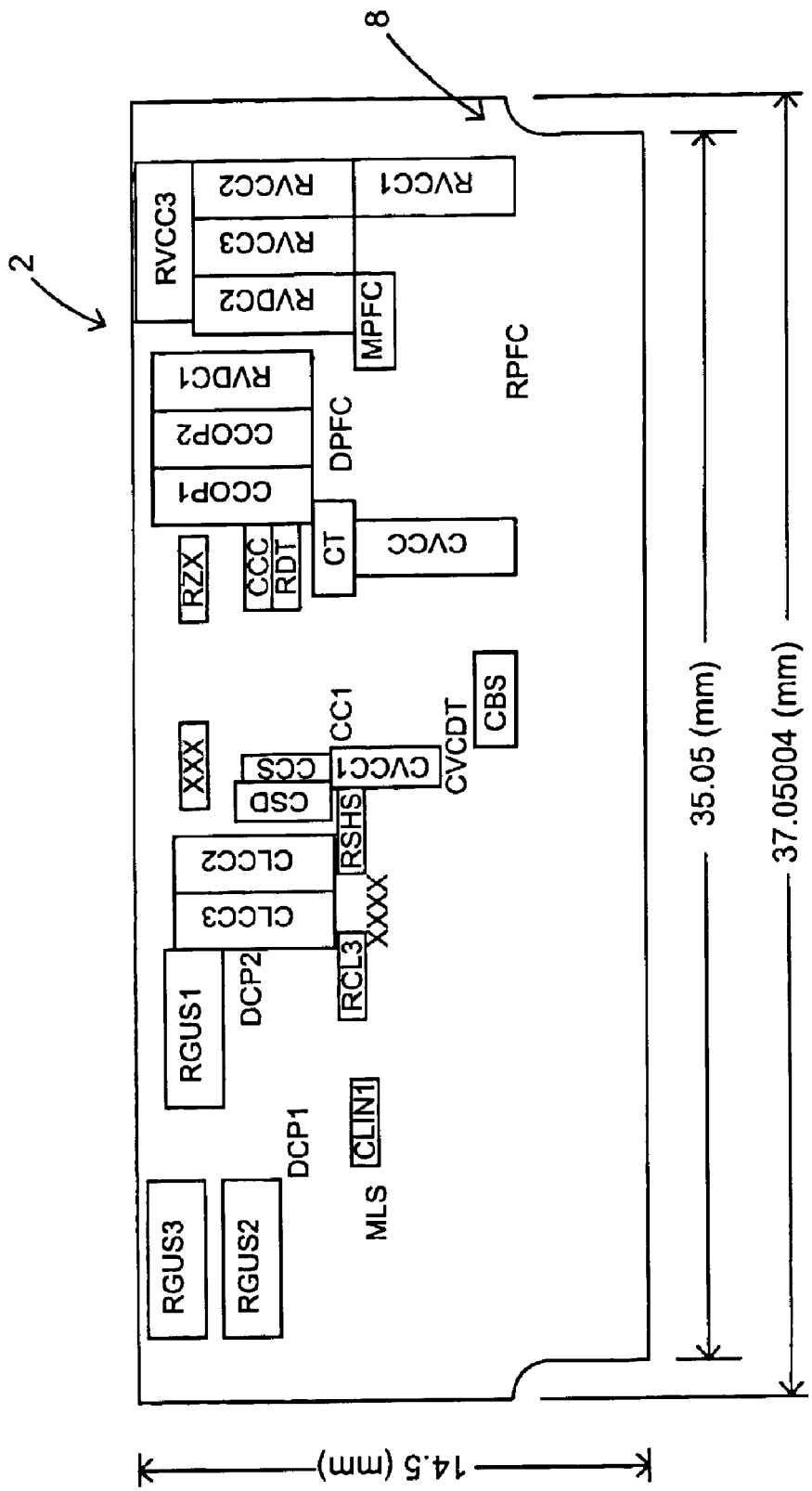
FIG. 4 shows the top silk layer of the ballast control card of FIG. 1.
Figure 5:
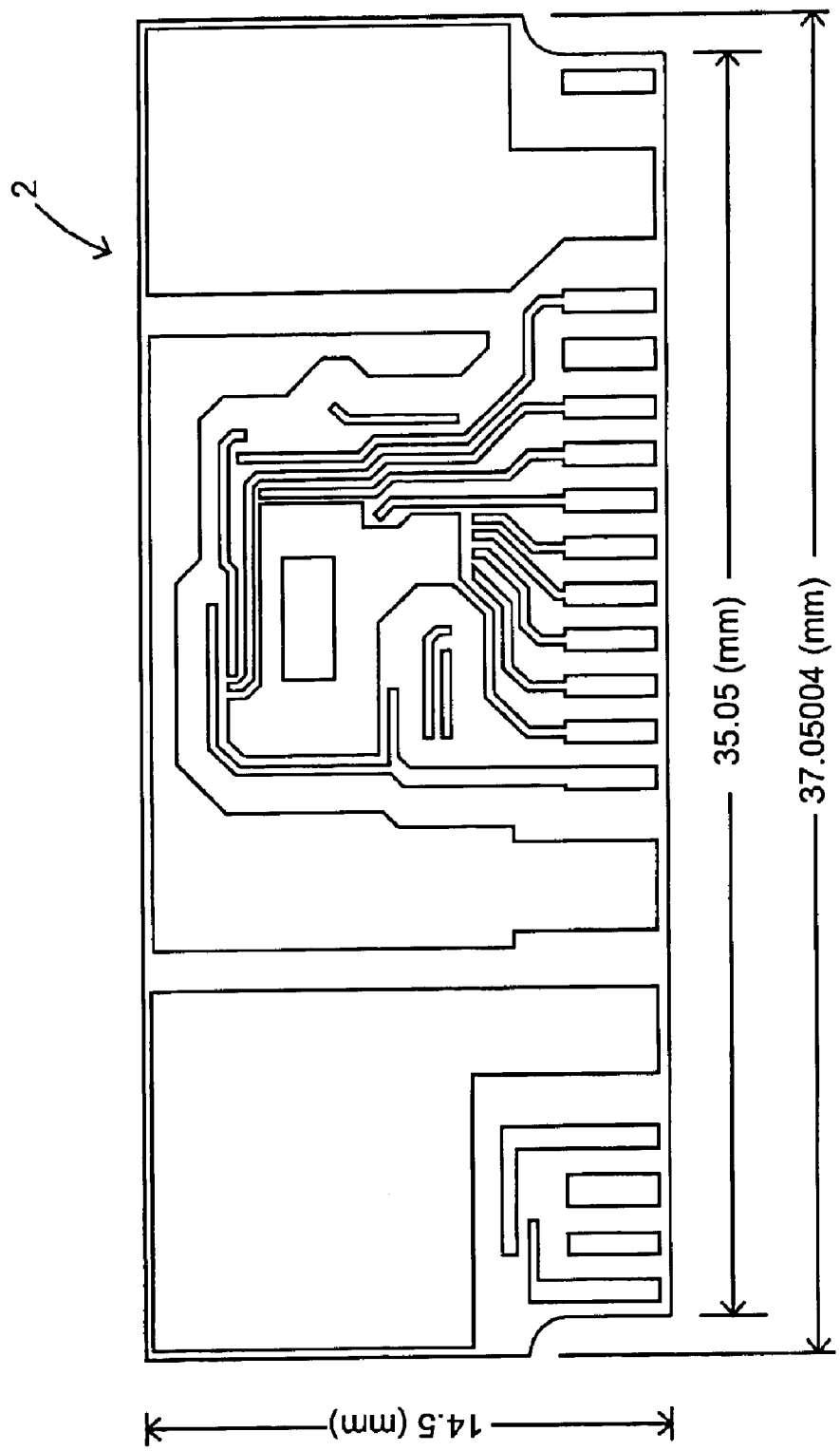
FIG. 5 shows a bottom trace layer of the ballast control card of FIG. 1.
Figure 6:
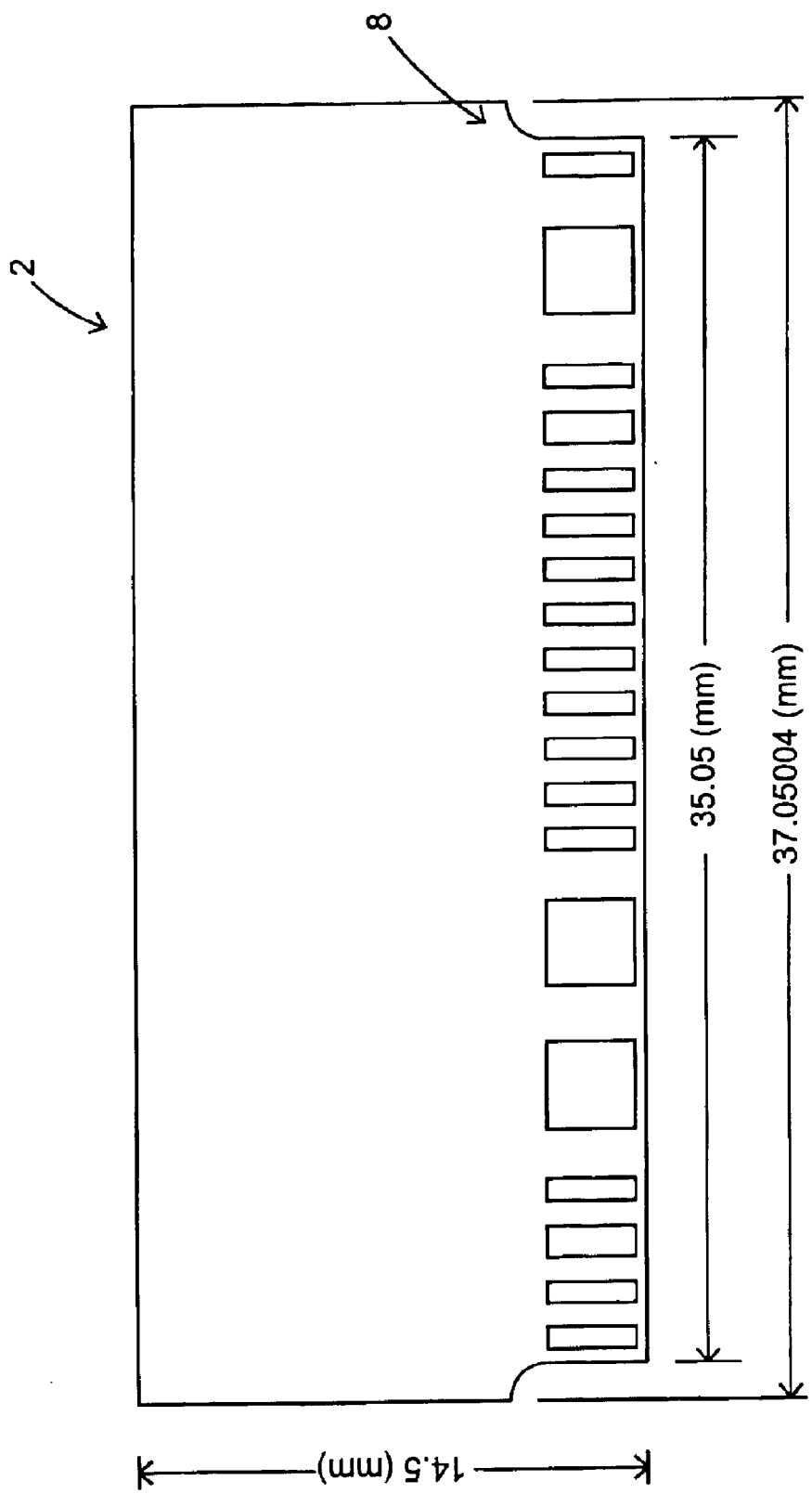
FIG. 6 illustrates a bottom solder mask for the ballast control card of FIG. 1.
Figure 7:
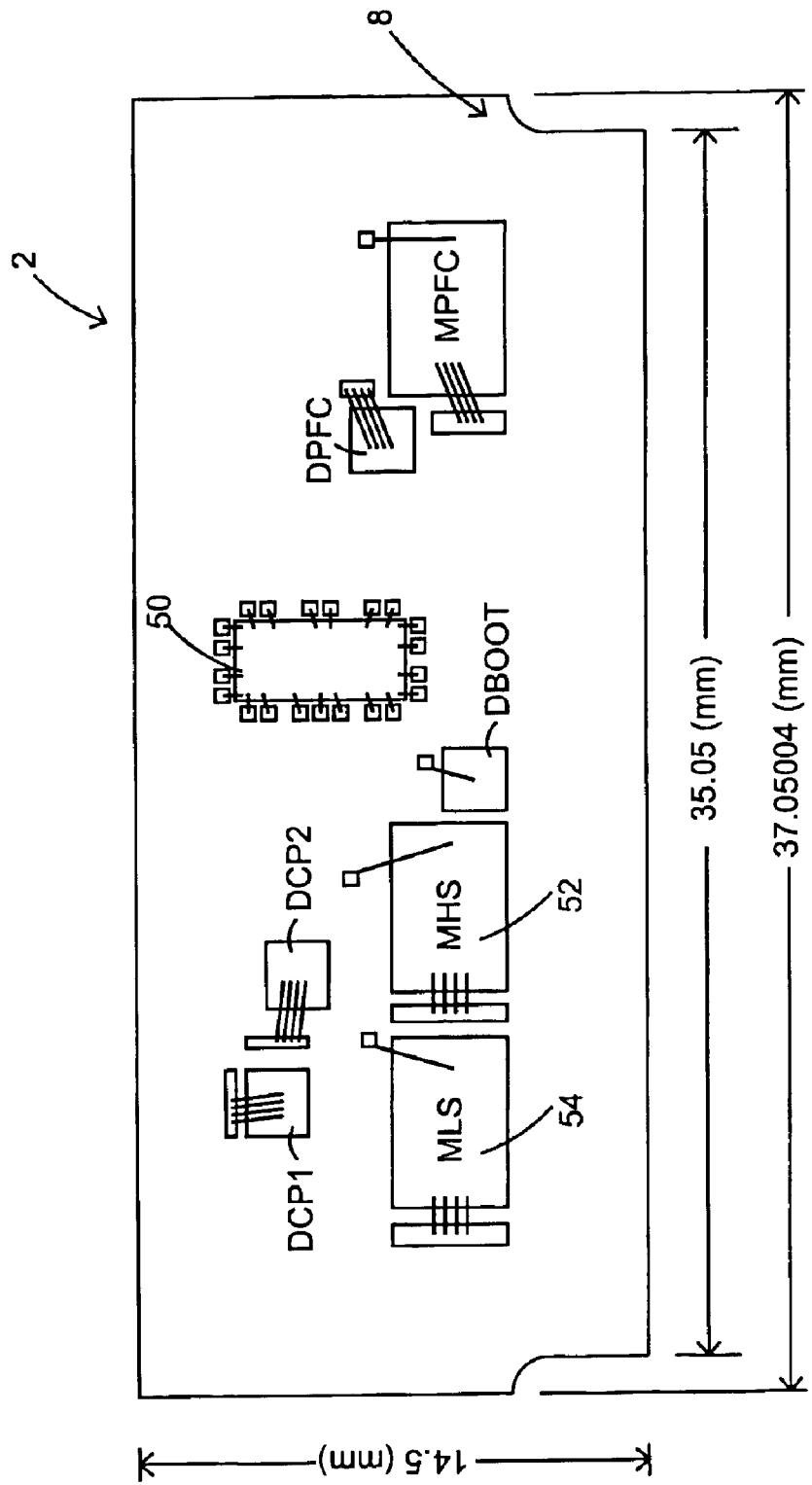
FIG. 7 illustrates bond wires of the ballast control card of FIG. 1.

Referring to FIGS. 2–7, the mechanical layout of the ballast control card is shown. FIG. 2 illustrates top layer traces, and FIG. 3 shows a top solder mask. A top silk screen layer is shown in FIG. 4. Bottom trace layer is shown in FIG. 5. FIG. 6 illustrates a bottom solder mask. Bond wires are shown in FIG. 7.

Figure 8:
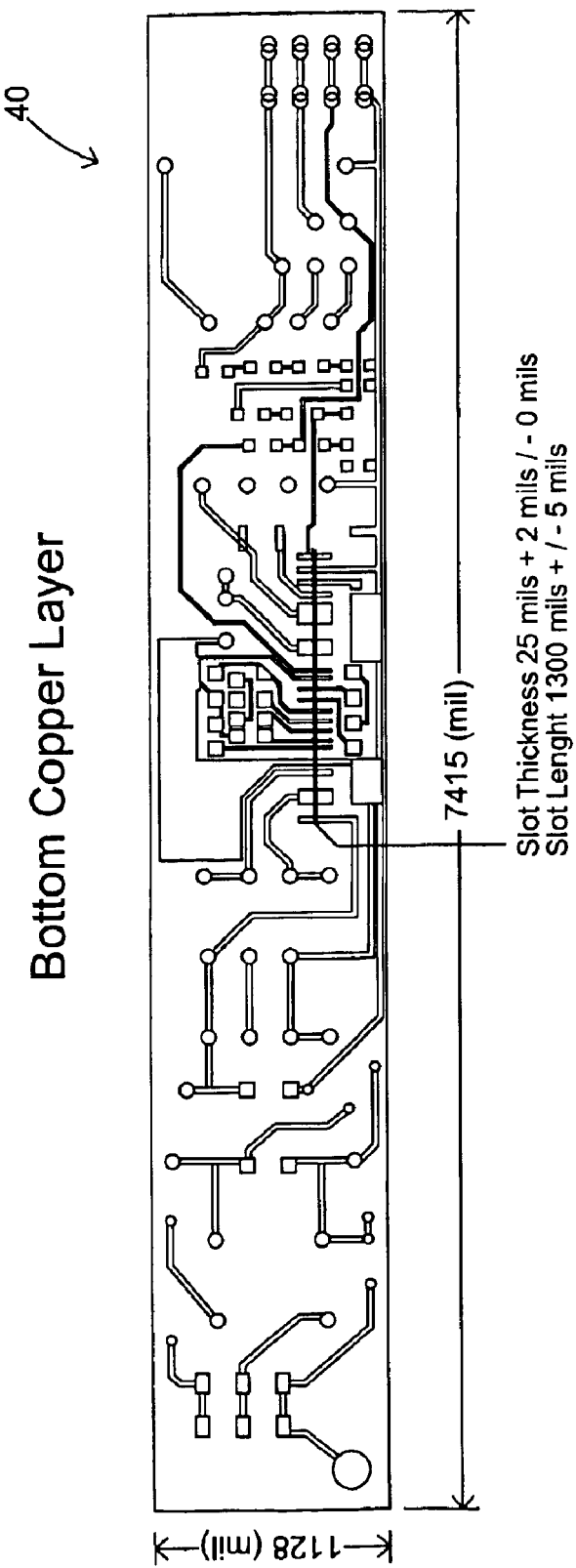
FIG. 8 shows a bottom copper layer for a ballast motherboard according to the present invention.
Figure 10:
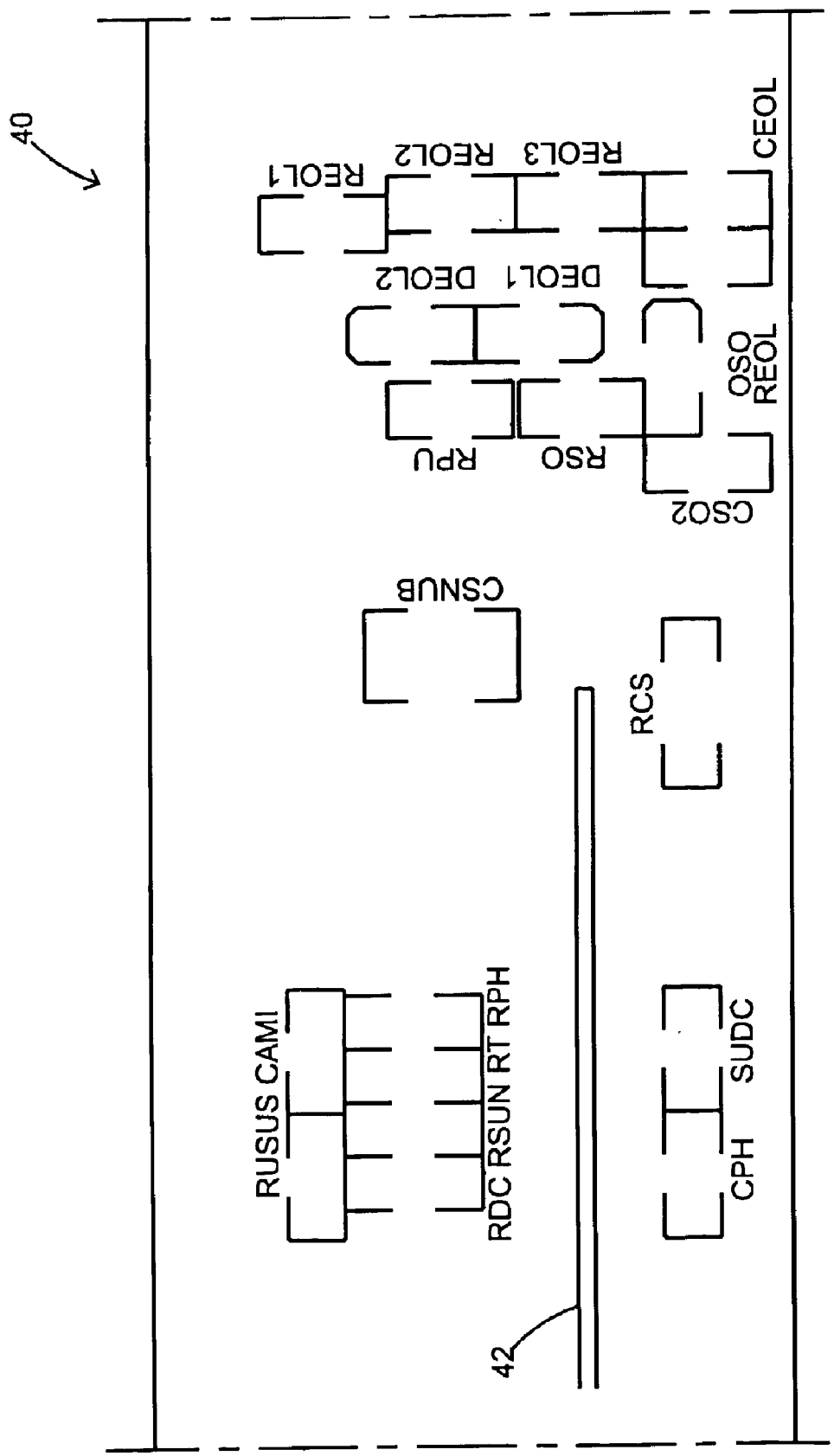
FIG. 10 illustrates a bottom silk screen layer of a ballast motherboard according to the present invention.

FIGS. 8–11 are mechanical drawings of the mother ballast board 40 according to the present invention. Mother board 40 includes a through-slot 42 which receives the connecting edge of ballast card 2. FIG. 8 illustrates a bottom copper layer on motherboard 40. FIG. 9 shows a top silk screen layer indicating a component layout, while FIG. 10 shows a bottom silk screen layer. FIG. 11 is a bottom solder mask for motherboard 40.

Figure 12:
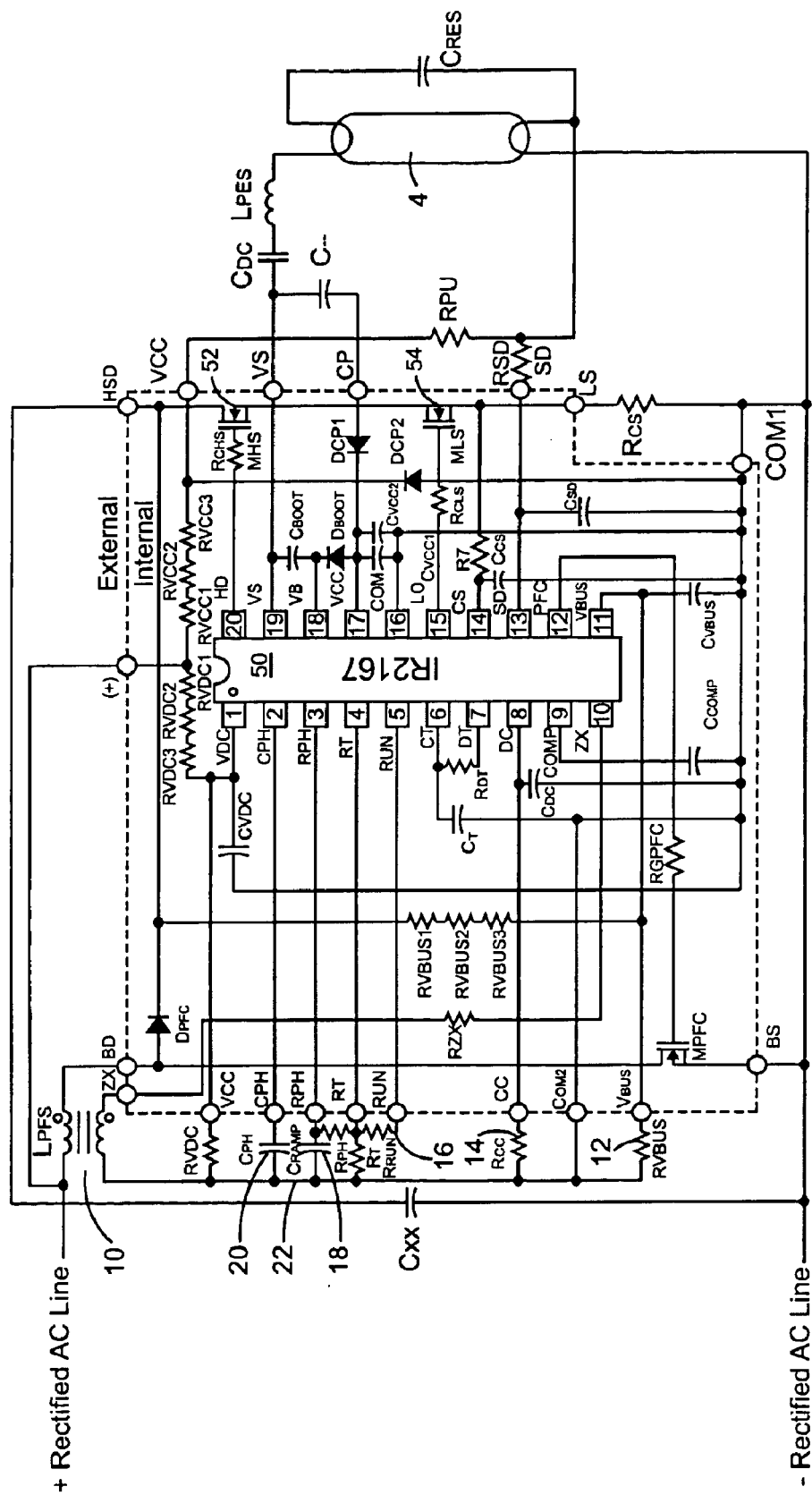
FIG. 12 is a schematic diagram of a ballast control card circuit according to the present invention.

Referring to FIG. 12, a schematic diagram of internal and external circuitry for the ballast control card of the present invention is shown. Component labels correspond to those in other drawings, particularly FIGS. 4 and 7 showing daughter card component layout. Note that the resistors labeled RVBUS 1–3 in FIG. 12 corresponds to resistors RBUS 1–3 in FIG. 4. Also, CCOMP 1 and 2 in FIG. 4 are equivalent to CCOMP in FIG. 12. Similarly, whereas FIG. 12 shows two bootstrap capacitors CVCC 1 and 2, FIG. 4 includes an additional capacitor CVCC3. Capacitor CBOOT and resistor R7 as labeled in FIG. 12 correspond to capacitor CBS and resistor RLIM1, respectively, in the FIG. 4 layout.

The ballast control is built around IC 50, illustratively a product of assignee, International Rectifier Corporation, identified as the IR2167 IC. Further implementation details are provided in the IR2167 data sheet, available from International Rectifier Corporation and in pending U.S. patent application Ser. No. 09/981,753, filed Oct. 19, 2001, both of which are incorporated herein by reference in their entirety.

The ballast control card incorporates both the high and low side drive MOSFETS 52 and 54 and the power factor correction MOSFET (MPFC) on a single board.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electronic ballast comprising:

a mother board;

a daughter board;

external components disposed on said mother board;

a plurality of power switching devices and control IC for controlling the operation of said power switching devices disposed on said daughter board; and control components for providing programmable features disposed on said daughter board, said programmable features including at least one of DC bus voltage level, preheat time and frequency, ignition ramp characteristics, and running mode operating frequency;

wherein the daughter board is vertically mounted and electrically connected to the mother board.

2. The electronic ballast of claim 1, wherein said daughter board includes edge connectors for electrically connecting to said mother board.

* * * * *